(12) United States Patent
Hada et al.

(10) Patent No.: US 6,178,626 B1
(45) Date of Patent: Jan. 30, 2001

(54) ELECTRONIC COMPONENT INSTALLATION METHOD

(75) Inventors: Junichi Hada; Kimiaki Sano; Atsushi Tanabe, all of Yamanashi (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/235,653

(22) Filed: Jan. 22, 1999

(30) Foreign Application Priority Data

Feb. 2, 1998 (JP) .................................................. 10-20966

(51) Int. Cl.[7] .................................................. H05K 3/30
(52) U.S. Cl. .................................. 29/833; 382/42; 382/49; 382/17; 29/717; 29/740; 29/832
(58) Field of Search ............................. 29/832, 740, 833, 29/712, 720; 382/41, 49, 176, 290

(56) References Cited

U.S. PATENT DOCUMENTS

| | | | | |
|---|---|---|---|---|
| 4,645,347 | * | 2/1987 | Rioux | 356/376 |
| 4,959,898 | * | 10/1990 | Landman et al. | 29/705 |
| 5,048,965 | * | 9/1991 | Amir | 356/376 |
| 5,097,516 | * | 3/1992 | Amir | 382/1 |
| 5,101,442 | * | 3/1992 | Amir | 382/41 |
| 5,105,857 | * | 4/1992 | Ellis | 140/105 |
| 5,379,514 | * | 1/1995 | Okuda et al. | 29/833 |
| 5,400,497 | * | 3/1995 | Watanabe et al. | 29/705 |
| 5,467,196 | * | 11/1995 | Fukushima et al. | 358/298 |
| 5,501,005 | * | 3/1996 | Onitsuka | 29/833 |
| 5,588,072 | * | 12/1996 | Wang | 382/176 |
| 5,668,898 | * | 9/1997 | Tatsuta | 382/290 |
| 5,671,007 | * | 9/1997 | Songer | 348/49 |
| 5,686,994 | * | 11/1997 | Tokura | 356/394 |
| 5,749,142 | * | 5/1998 | Hanamura | 29/833 |
| 5,787,577 | * | 8/1998 | Kent | 29/833 |
| 5,956,134 | * | 9/1999 | Roy et al. | 356/237.5 |

* cited by examiner

Primary Examiner—Carl J. Arbes
(74) Attorney, Agent, or Firm—Price and Gess (57) ABSTRACT

In an electronic component installation device for manufacturing an electronic circuit substrate, wherein components are picked up from a parts supply device and placed on a circuit substrate, the height of the installing surface s of an electronic component 10 from a reference surface is detected with the use of a three-dimensional imaging device 2, and the distance the suction nozzle 9 of the mounting head 1 is lowered is accurately determined with respect to each of electronic components that vary in thickness.

19 Claims, 10 Drawing Sheets

ELECTRONIC COMPONENT INSTALLATION METHOD

BACKGROUND OF THE INVENTION

1. Field of the Invention

The present invention relates to an electronic component installation device and method for manufacturing an electronic circuit substrate by installing a large number of parts such as electronic components on a circuit substrate.

2. Description of Related Art

Figure 13:
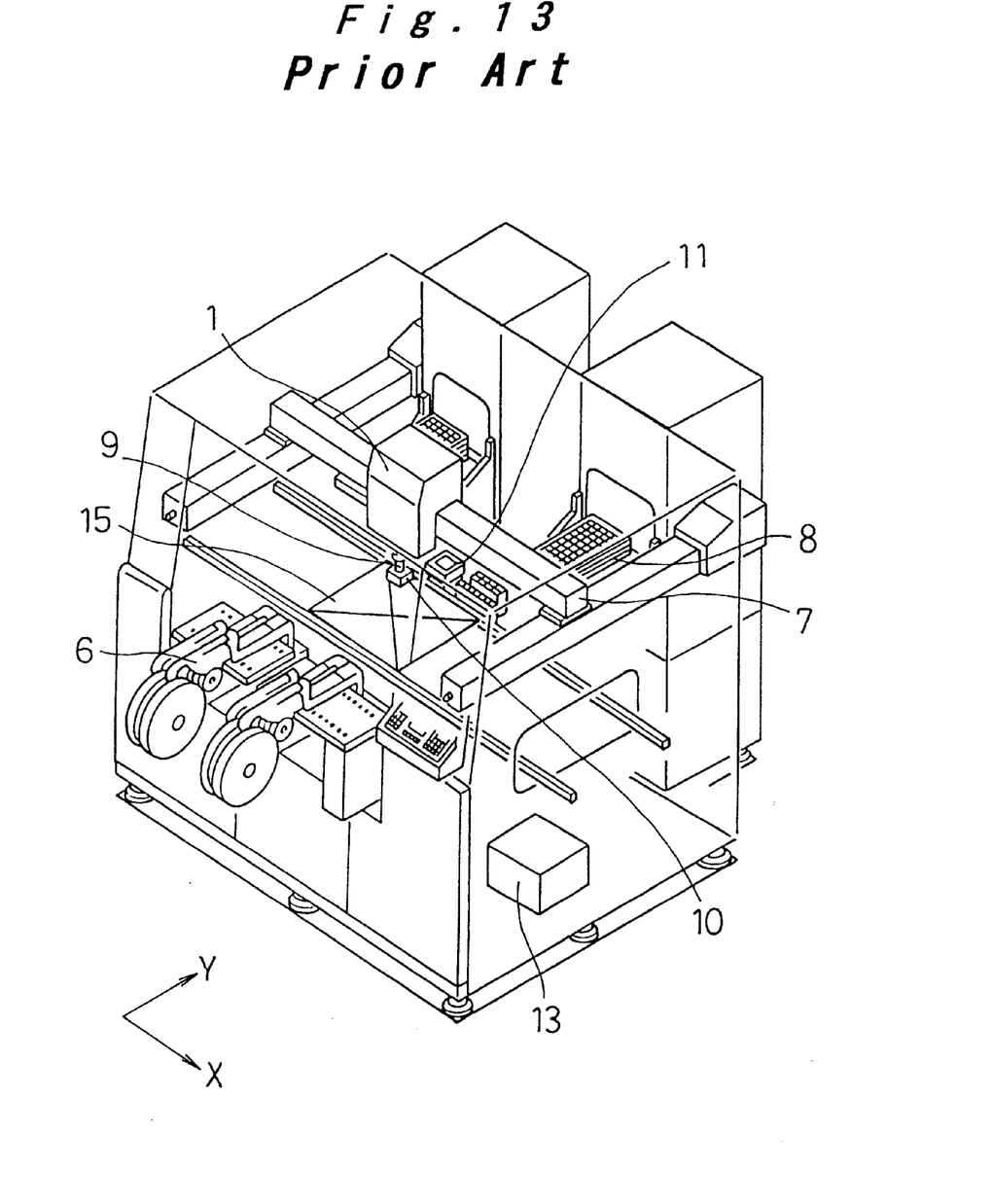
FIG. 13 is a perspective view showing the construction of a prior art electronic component installation device.

FIG. 13 shows one example of an electronic component installation device. A mounting head 1 mounted on an XY robot 7 is constructed such that it is capable of picking up an electronic component 10 supplied from a parts tray 8 or parts cassette 6 with a suction nozzle 9 and placing it on a circuit substrate 15. Such electronic component installing actions are controlled by a controller 13 according to a prescribed installation program.

In FIG. 13, when the circuit substrate 15 is carried in and positioned at a prescribed location, the mounting head 1, which is capable of freely moving in X- and Y-directions by the function of the XY robot 7, picks up the electronic component 10 from the parts cassette 6 or parts tray 8 and moves to a point above a recognition camera 11 where the attitude of the electronic component 10 is recognized. Based on the recognition results, the attitude of the electronic component is corrected, after which it is installed on the circuit substrate 15 at a predetermined location. These actions are repeated until all of the electronic components needed for one circuit substrate are installed, and the circuit substrate which has been installed with all necessary parts is taken out, while a new circuit substrate is carried in for another cycle of installing operation repeating the above actions.

There are various kinds of electronic components 10 to be installed with the mounting head, and accordingly the thickness or height of the electronic components in a installing direction is diversified. Thus, when placing electronic components on the circuit substrate 15 with the mounting head 1, the distance the suction nozzle 9 descends towards the circuit substrate 15 needs to be varied in accordance with the height of the electronic component in the installing direction. This amount of downward movement of the suction nozzle 9 is normally determined as described below. The thickness of each of the electronic components is preliminarily measured using a slide caliper or the like, and component data is prepared based on this measurement in which thickness is determined with respect to each type of electronic components. This component data is used in an installation program for controlling actions of the mounting head 1. The mounting head 1 is controlled such as to lower the suction nozzle 9 a distance corresponding to the thickness of each of the electronic components stored in the component data when placing it on the circuit substrate 15.

However, with increasing employment of a large-scale integrated circuit or an odd-shape outer package in response to demands for more complex electronic circuits and for higher mounting density, electronic components of recent years, especially those which include very narrowly pitched leads or fragile packages, require more delicate handling. It is thus essential to avoid exerting a load on electronic components greater than necessary when placing them on the circuit substrate. In other words, the amount of descending movement of the suction nozzle effected by the mounting head must be precisely controlled.

However, in the information regarding dimensions of electronic components particularly in the thickness direction in the above mentioned component data based on which the descending amount of the suction nozzle is controlled, measurement errors or errors in dimensions of the electronic components are inevitably included. Especially when installing electronic components with minute leads or any other type of fragile components, such errors may well lead to mounting failures or cause damages to these electronic components.

BRIEF SUMMARY OF THE INVENTION

In view of the above problems in the prior art, an object of the present invention is to provide an electronic component installation device which is capable of installing electronic components without damaging them.

To achieve the above object, the method of installing an electronic component on a circuit substrate according to the present invention comprises the steps of: moving on a horizontal plane a mounting head equipped with a parts holding means with which the electronic component is held; picking up a prescribed electronic component with the parts holding means from a parts supply section; moving the mounting head which has picked up the electronic component from the parts supply section to a point above a three-dimensional imaging device; detecting a height of an installing surface of the electronic component from a reference surface; determining an amount of lowering the parts holding means based on a detected result; and lowering for the parts holding means, which has been brought to a point above an installing location on the circuit substrate that is located at a prescribed position, with the determined descending amount, so as to install the electronic component on the circuit substrate.

According to the above installation method, the height of the installing surface in the installing direction of each discrete electronic component held by the parts holding means is detected with the three-dimensional imaging device, and the parts holding means is descended by the mounting head based on this detected height information. Thus, an excessive load will not be exerted on the electronic component that may be caused by errors in dimensions of the electronic component, and even precise or fragile components can be mounted without being damaged.

Further, the method of installing an electronic component on a circuit substrate according to the present invention comprises the steps of: preparing component data by measuring dimensions of electronic components and preliminarily storing the component data with respect to every type of electronic components to be installed; moving on a horizontal plane a mounting head equipped with a parts holding means with which the electronic component is held; picking up a prescribed electronic component with the parts holding means from a parts supply section; moving the mounting head which has picked up the electronic component from the parts supply section to a point above a three-dimensional imaging device; detecting a height of a installing surface of the electronic component from a reference surface; correcting the component data of the electronic component based on a detected result; determining a lowering amount of the parts holding means in accordance with the corrected information; and lowering the parts holding means, which has been brought to a point above an installing location on the circuit substrate that is located at a prescribed position, with the determined descending amount, so as to install the electronic component on the circuit substrate.

According to the above installation method, the height of the installing surface in the installing direction of each discrete electronic component held by the parts holding means is detected with the three-dimensional imaging device, the data on the thickness of the electronic component in the installing direction which has been preliminarily measured and stored is corrected based on this detected height information, and the parts holding means is descended by the mounting head based on this corrected height information. Thus, an excessive load will not be exerted on the electronic component that may be caused by measuring errors or errors in dimensions of the electronic component, and even precise or fragile components can be mounted without being damaged.

In the above installation method, the height of the installing surface of the electronic component with the three-dimensional imaging device is detected such that a portion within an electronic component existing area in a three-dimensional image of the electronic component where a greatest value is detected is determined to be the installing surface of the electronic component. Connecting leads or the like of the electronic components that are provided for connection thereof to a pattern of circuit formed on the surface of the circuit substrate are normally formed most prominently in a height direction. Accordingly, the installing surface of the electronic component can be correctly determined with this method except for odd-shape electronic components.

Alternatively, the height of the installing surface of the electronic component may be detected such that an area which is larger than the noise size in a three-dimensional image but as small as possible is defined to be a reference area, cross-sectional areas of the electronic component are obtained, which are then compared with the reference area, and a height at which this reference area is detected is determined to be the height of the installing surface of the electronic component. The noises are inevitably included in the image, in order to avoid detection error caused by these noises, the reference area is determined to be as small as possible but greater than the noise size, whereby accurate height detection is achieved.

Alternatively, the height of the installing surface of the electronic component may be detected such that, by reference to a cross-sectional area of the installing surface of the electronic component which is already known, a height at which this reference area is detected in the three-dimensional image is defined to be the height of the installing surface of the electronic component. Some odd-shape electronic components have protruded portions on their installing surface, which will be accommodated in corresponding openings formed on the circuit substrate upon mounting the electronic component. When detecting the height of the installing surface of the electronic component, such protruded portions are detected to be nearest from the light source and thus erroneously taken as the bottom of the electronic component. To avoid this, the cross-sectional area of the installing surface of the electronic component which is preliminarily known is used as a reference area, and the height at which this reference area is detected from the three-dimensional image is defined to be the height of the installing surface of the electronic component. Detection error caused by protruded portions of the electronic component can be thus avoided.

The above described height detection using a specified reference area is effected such that a histogram of detection frequency at each height position detected from the three-dimensional image is made, and cross-sectional areas of the electronic component at each height position obtained from the histogram are compared with the reference area. The height at which the cross-sectional area of the electronic component equals to the reference area is defined to be the height position of the installing surface of the electronic component.

Furthermore, in the above installation method, when a detected height data is an abnormal value, it is judged that the electronic component is not correctly held by the parts holding means. In case the height data is detected to be zero, it is judged that the parts holding means has failed to pick up the electronic component, and when the height greatly differs from the height of the electronic component in the installing direction which has been preliminarily determined, it is judged that the electronic component is not held by the parts holding means in a correct attitude.

Moreover, pressing control start position which has been preliminarily determined can be corrected based on the detected height information. In case of handling electronic components of insertion type or bump connection type, it is necessary to press the electronic component against the circuit substrate with a predetermined pressure, and such pressing control is started when a lead or a bump reaches a certain height position close to the circuit substrate. Since this pressing control start position is accurately determined, the starting position can be set to a position closer to the circuit substrate, whereby mounting efficiency can be enhanced.

Other objects and features of the invention will become clear through the detailed description of the invention and the drawings provided below.

DESCRIPTION OF THE PREFERRED EMBODIMENTS

Preferred embodiments of the present invention will be hereinafter described with reference to the accompanying drawings.

Figure 1:
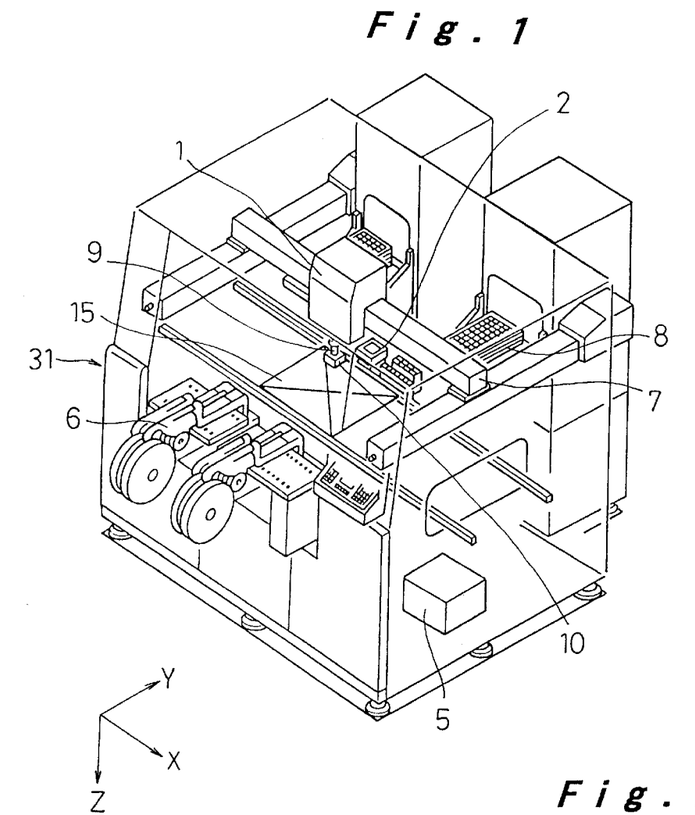
FIG. 1 is a perspective view showing the construction of an electronic component installation device according to one embodiment of the present invention.

FIG. 1 shows an electronic component installation device with which the installation method of the present invention is implemented. The elements which are commonly used in the conventional arrangement described above are given the same reference numerals.

In FIG. 1, the electronic component installation device 31 is constructed such that various electronic components to be mounted are fed from parts cassettes 6 and parts trays 8, and a mounting head 1 which is freely movable on a plane defined by X and Y axes driven by the X-Y robot 7 picks up a predetermined electronic component 10 with a suction nozzle (parts holding means) 9 from the parts cassettes 6 or parts trays 8 and places it at a prescribed location on the circuit substrate 15. Actions of this component installing operation are controlled by the controller 5 which executes a prescribed installing program.

The mounting head 1 causes the suction nozzle 9 to descend in a vertical direction (Z-axis direction) from the XY plane with a predetermined descending amount, when picking up electronic components 10 from the parts cassettes 6 or parts trays 8, or when installing them on the circuit substrate 15. Since there are a variety of components to be installed which are different in height in an installing direction, it is necessary to set an appropriate lowering amount of the suction nozzle 9 for each type of electronic components 10, so that the amount of pressing force exerted to the electronic components is constant at the time when the electronic components are brought into contact with the circuit substrate 15.

Figure 2:
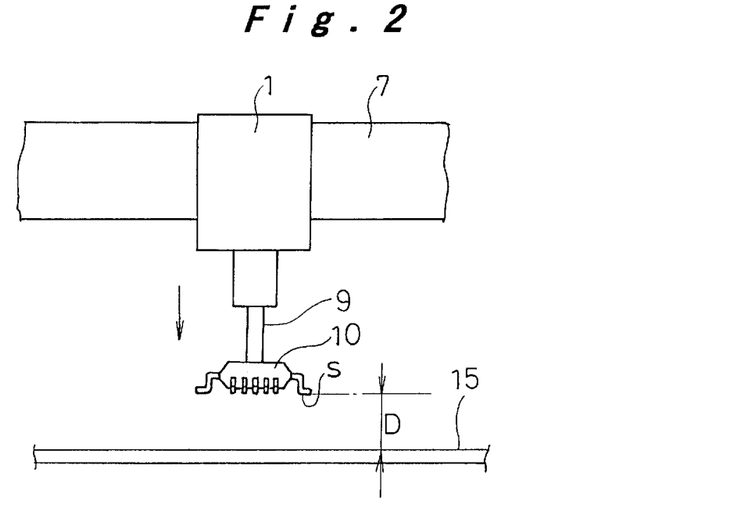
FIG. 2 is a front elevation view showing the positional relationship between an electronic component and a circuit substrate when the electronic component is being mounted to the circuit substrate.

As shown in FIG. 2, the suction nozzle 9 is lowered with a descending amount which is slightly greater than a distance D between the installing surface s of the electronic component 10 and the surface of the circuit substrate 15, so that the component is installed on the circuit substrate 15 in such a manner as to be pressed thereonto. The suction nozzle 9 is lowered with an amount slightly greater than the distance D towards the circuit substrate 15, on which a paste of cream solder or an adhesive has been applied, so that the electronic component 10 is pressed against the circuit substrate 15 without allowing any gaps to be left between the installing surface and the cream solder or adhesive, whereby the electronic component 10 is placed on the circuit substrate 15 in tight contact therewith. The suction nozzle 9 is biased by a spring (not shown) towards the installing direction, so that when it is descended a distance greater than the distance D and contacted to the circuit substrate 15, the suction nozzle 9 retracts against the force of the spring, thereby absorbing the impact caused by the additional descending amount over the distance D. The electronic component 10 is thus prevented from being damaged by an excessive load exerted thereto.

Nevertheless, in case the electronic component 10 is a large-scale integrated circuit component such as the quad flat package (QFP) type shown in the figure, which comprises an increased number of thin leads at a narrow pitch, a load more than necessary at the time of installation will cause mounting failures due to deformed leads. Also, fragile parts such as chip size package (CSP) type may well be destroyed when too much load is exerted thereon at the time of installation.

In order to prevent installing failures or damages to such delicate electronic components, the descending amount of the suction nozzle 9 when installing the electronic components is accurately controlled in this embodiment. For that purpose, a three-dimensional imaging device 2 is disposed at the position where the recognizing camera 11 is normally installed in the prior art (see FIG. 13), with which the attitude of the electronic component 10 in a horizontal plane is detected as in the conventional arrangement, as well as the distance D or height of the installing surface of the electronic component 10 which is to be contacted with the circuit substrate 15 from a reference surface (i.e. the distance between the installing surface and the reference surface) is detected. The electronic component installation method utilizing detected height of the installing surface of the electronic component by this three-dimensional imaging device 2 will be described below.

Figure 3:
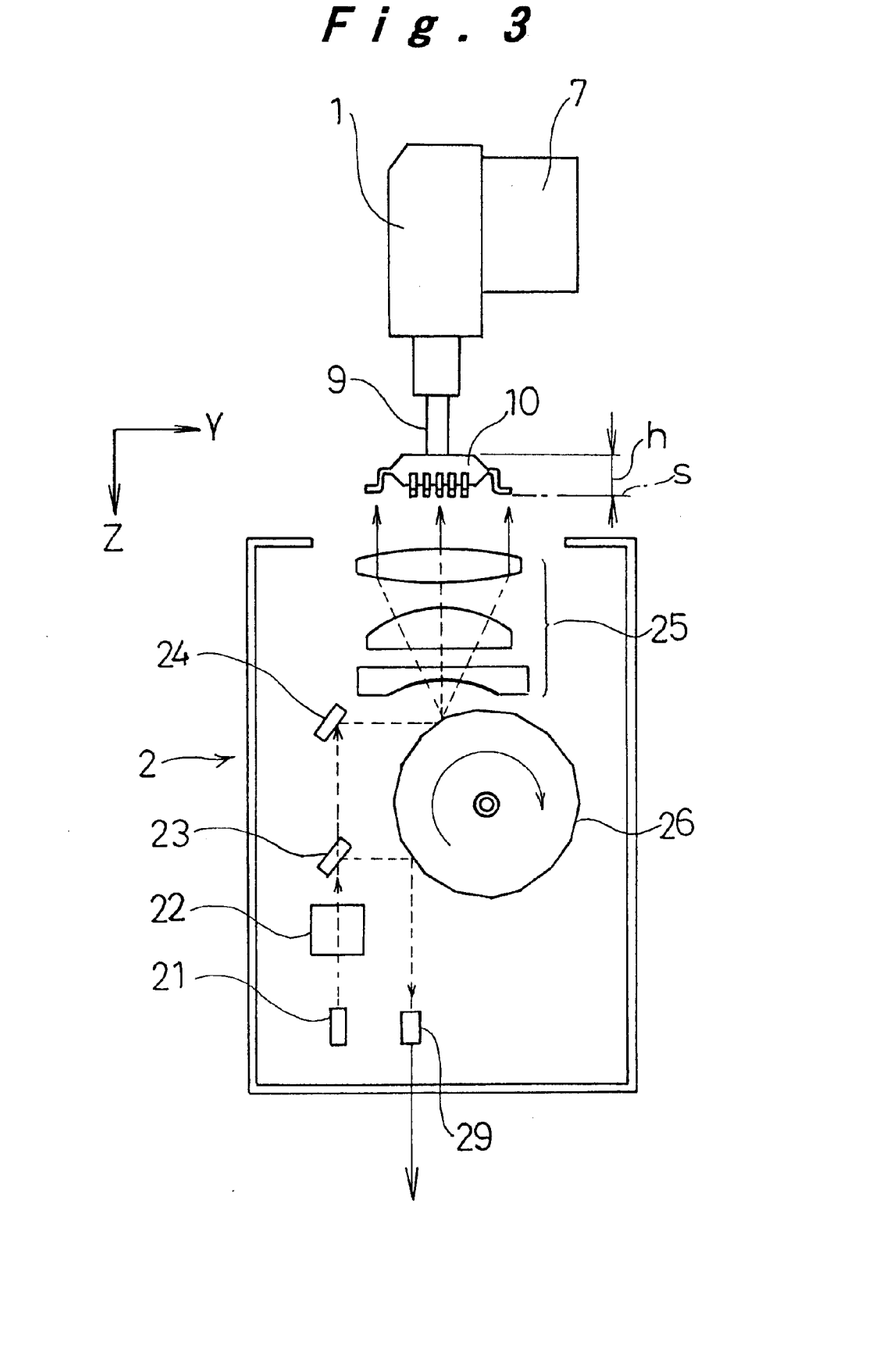
FIG. 3 is a diagram showing the construction of a three-dimensional imaging device viewed from a Y-axis direction.
Figure 4:
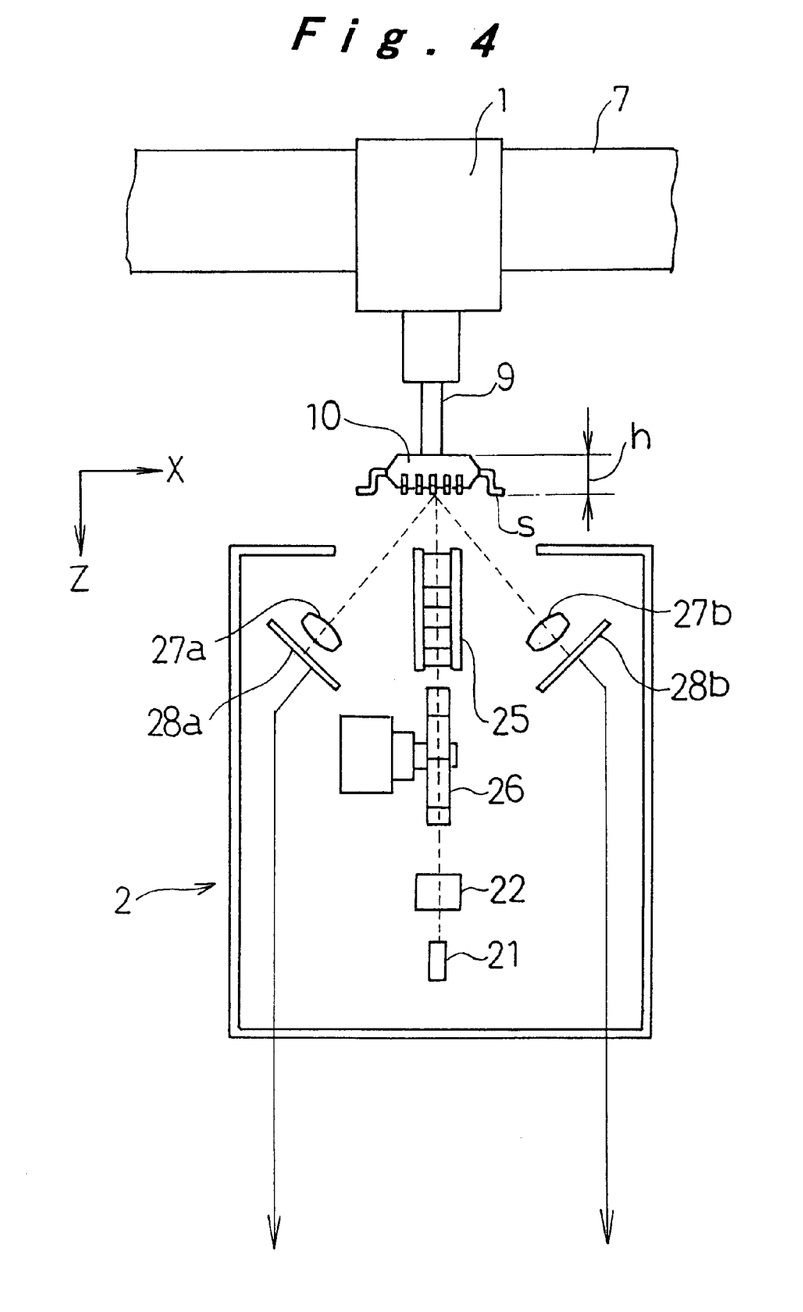
FIG. 4 is a diagram showing the construction of a three-dimensional imaging device viewed from an X-axis direction.

The mounting head 1, after picking up the electronic component 10 with the suction nozzle 9 from the parts cassette 6 or parts tray 8, moves to a point above the three-dimensional imaging device 2, where a three-dimensional image of the electronic component 10 is obtained by laser beam scanning. The three-dimensional imaging device 2 is constructed as shown in FIGS. 3 and 4, and will be described later in detail. Displacement of position and angle of the electronic component 10 in the X and Y directions from a predetermined position which are detected from this three-dimensional image are corrected by the movements of the mounting head 1 in the X and Y directions and by the rotation of the suction nozzle 9. Also, the height of the installing surface s of the electronic component 10 from the above-mentioned reference surface is detected from the three-dimensional image, and the descending amount of the suction nozzle 9 for the installing action is determined based on this height data. As the reference surface, for example, the surface of the circuit substrate 15 which is positioned at a prescribed location may be used as shown in FIG. 2, or the distal end of the suction nozzle 9 or any other surface may be appropriately selected.

FIG. 3 shows the arrangement of the three-dimensional imaging device 2 viewed from the X-axis direction, and FIG. 4 shows the same viewed from the Y-axis direction. As shown in FIG. 3, a laser beam emitted from a laser oscillator 21 is adjusted to be a parallel beam of a prescribed diameter by a collimator lens 22. The parallel beam is then branched by a beam splitter 23 into a main beam and a reference beam. The main beam is directed to a polygon mirror 26 by means of a mirror 24, by which the laser beam swept in the Y-axis direction is projected through a group of lenses 25 onto the electronic component 10.

Referring to FIG. 4, the mounting head 1 moves to a point above the three-dimensional imaging device 2 at a fixed rate in the X-axis direction; this movement of the mounting head 1 in the X-axis direction, combined with the sweep of the laser beam in the Y-axis direction by means of the polygon mirror 26, permits the electronic component 10 to be scanned with the laser beam on the X-Y plane. The light reflected from the electronic component 10 scanned with the laser beam enters light-receiving elements 28a, 28b through light-receiving lenses 27a, 27b as shown in FIG. 4, which is then converted into electrical signals and inputted into an image processing unit (not shown). Meanwhile, another branched laser beam which has been bifurcated by the beam splitter 23 and reflected by the polygon mirror 26 as shown in FIG. 3 is converted into electrical signals in a reference beam receiving element 29 which are similarly inputted into the image processing unit. The image processing unit determines a three-dimensional image of the electronic component 10 based on the electrical signals inputted from each of the light-receiving elements 28a, 28b, 29, and, from the obtained image, the attitude of the electronic component 10 as well as the height of the installing surface thereof from the reference surface are detected.

The component installing operation with the above-described structure is carried out in a manner described below. In the first installation method described below, the descending amount of the suction nozzle 9 at the installing location is determined based on the height data of the installing surface of the electronic component in the installing direction which is detected by the three-dimensional imaging device 2, following the steps shown in the flowchart of FIG. 5.

Figure 5:
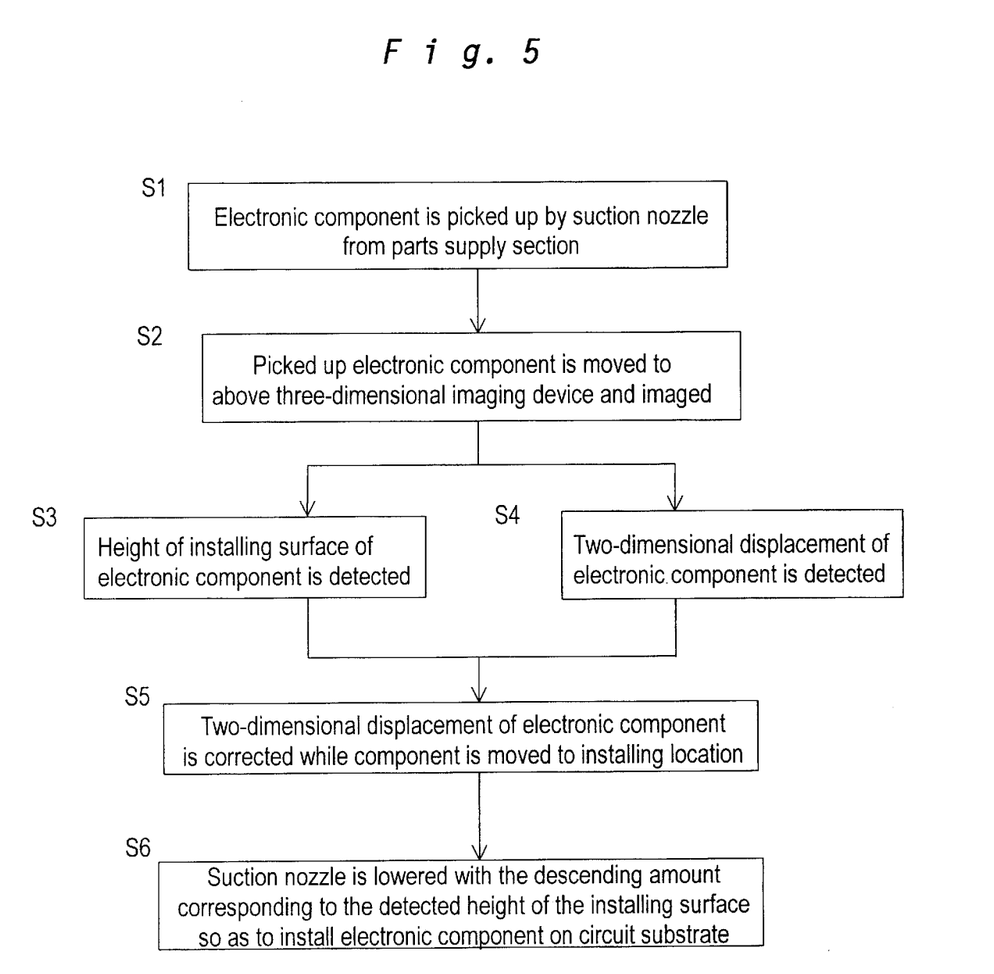
FIG. 5 is a flowchart showing the procedure of a first installation method according to the present invention.

The mounting head 1 is transferred to a point above the parts cassette 6 or parts tray 8 in a parts supply section where the specified electronic components 10 are supplied in the mounting order by the control of the controller 5, and picks up a required electronic component 10 with the suction nozzle 9 (S1). Next, the picked-up electronic component 10 is imaged by the movement of the mounting head 1 above the three-dimensional imaging device 2 (S2). The three-dimensional image obtained by this imaging is processed so as to detect the height of the installing surface of the electronic component 10 (S3), as well as to detect two-dimensional displacement or attitude of the electronic component 10 (S4). The mounting head 1, while moving to a point above the installing location on the circuit substrate 15, corrects the detected two-dimensional positional displacement (S5). The mounting head 1 which has been transferred to the point above the installing location lowers the suction nozzle 9 with the descending amount corresponding to the detected height of the installing surface of the electronic component 10 in the installing direction so as to install the electronic component 10 on the circuit substrate 15 (S6).

By this method, since the height of the installing surface of the electronic component from the reference surface is detected each time one component is installed, and the descending amount of the suction nozzle 9 is determined based on this detected value, a constant amount of pressure is properly applied to the electronic component at the time of installation irrespective of errors in dimensions of components, and fragile electronic components can be prevented from being damaged.

Figure 6:
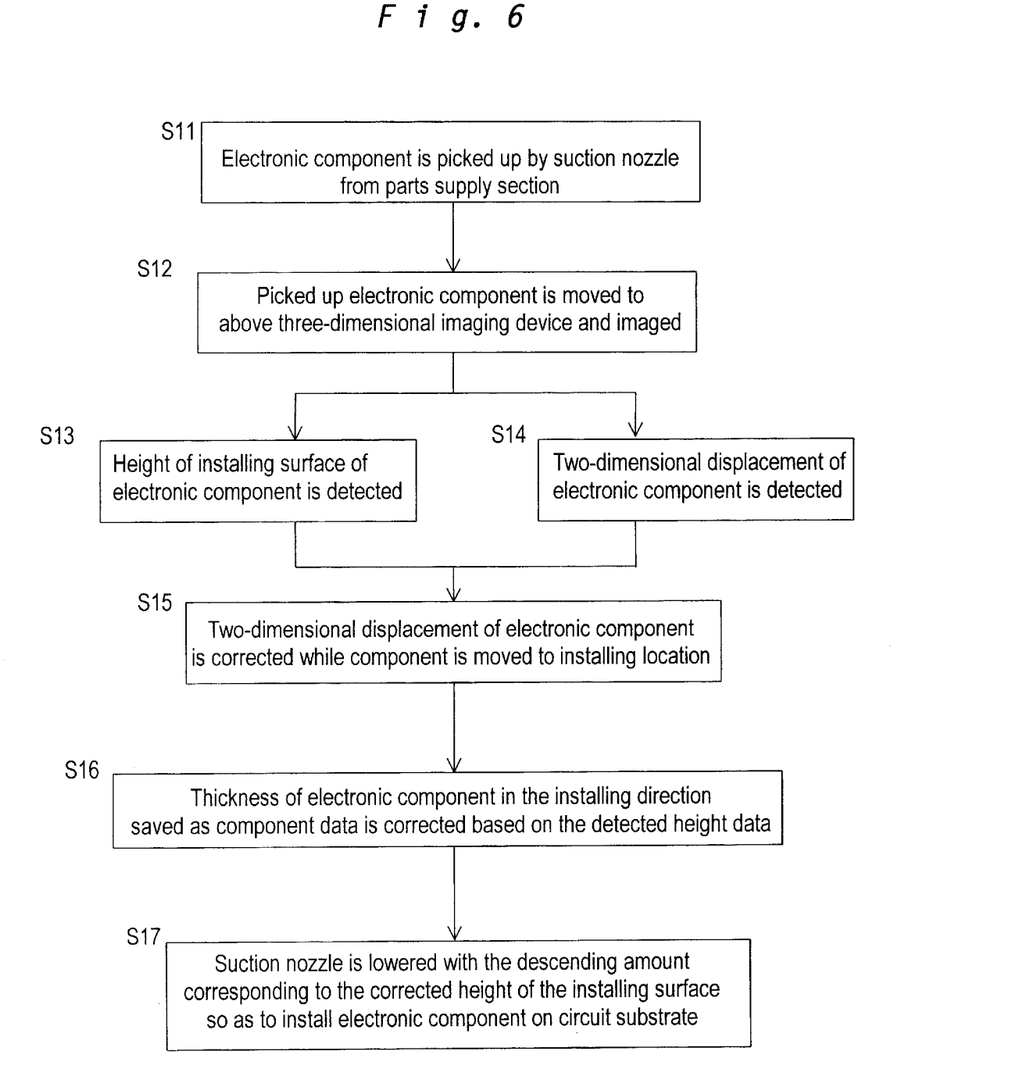
FIG. 6 is a flowchart showing the procedure of a second installation method.

Next, the second installation method will be explained with reference to the flowchart of FIG. 6. In this method, the thickness or height of electronic components 10 in the installing direction (h shown in FIG. 3) is preliminarily measured with respect to each type of components and saved in the controller 5 as a component data, and this component height data is corrected based on the height detection with the three-dimensional imaging device 2.

The mounting head 1 is transferred to a point above the parts cassette 6 or parts tray 8 in the parts supply section where the specified electronic components 10 are supplied in the mounting order by the control of the controller 5, and picks up the required electronic component 10 with the suction nozzle 9 (S11). Next, the picked-up electronic component 10 is imaged by the movement of the mounting head 1 above the three-dimensional imaging device 2 (S12). The three-dimensional image obtained by this imaging action is processed so as to detect the height of the installing surface of the electronic component 10 (S13), as well as to detect two-dimensional displacement (attitude) of the electronic component 10 (S14). The mounting head 1, while moving to a point above the installing location on the circuit substrate 15, corrects the detected two-dimensional positional displacement (S15). Further, the height or thickness of the electronic component 10 in the installing direction which has been preliminarily saved as the component data is corrected based on the detected height of the installing surface of the electronic component 10 (S16). The mounting head 1 which has been transferred to above the installing location lowers the suction nozzle 9 the distance corresponding to the corrected height or thickness of the electronic component so as to install the electronic component 10 on the circuit substrate 15 (S17).

By this method, with respect to each discrete electronic component 10 to be installed, the distance between the installing surface of the electronic component 10 and the reference surface is detected, and the height or thickness of the electronic component 10 in the installing direction which has been preliminarily stored as the component data is corrected based on the detected result, and the descending amount of the suction nozzle 9 is determined based on the corrected data of the thickness of the electronic component 10. Pressure is thus applied to the component appropriately at the time of installation irrespective of errors in dimensions of the components, and fragile electronic components 10 can be prevented from being damaged.

Figure 7:
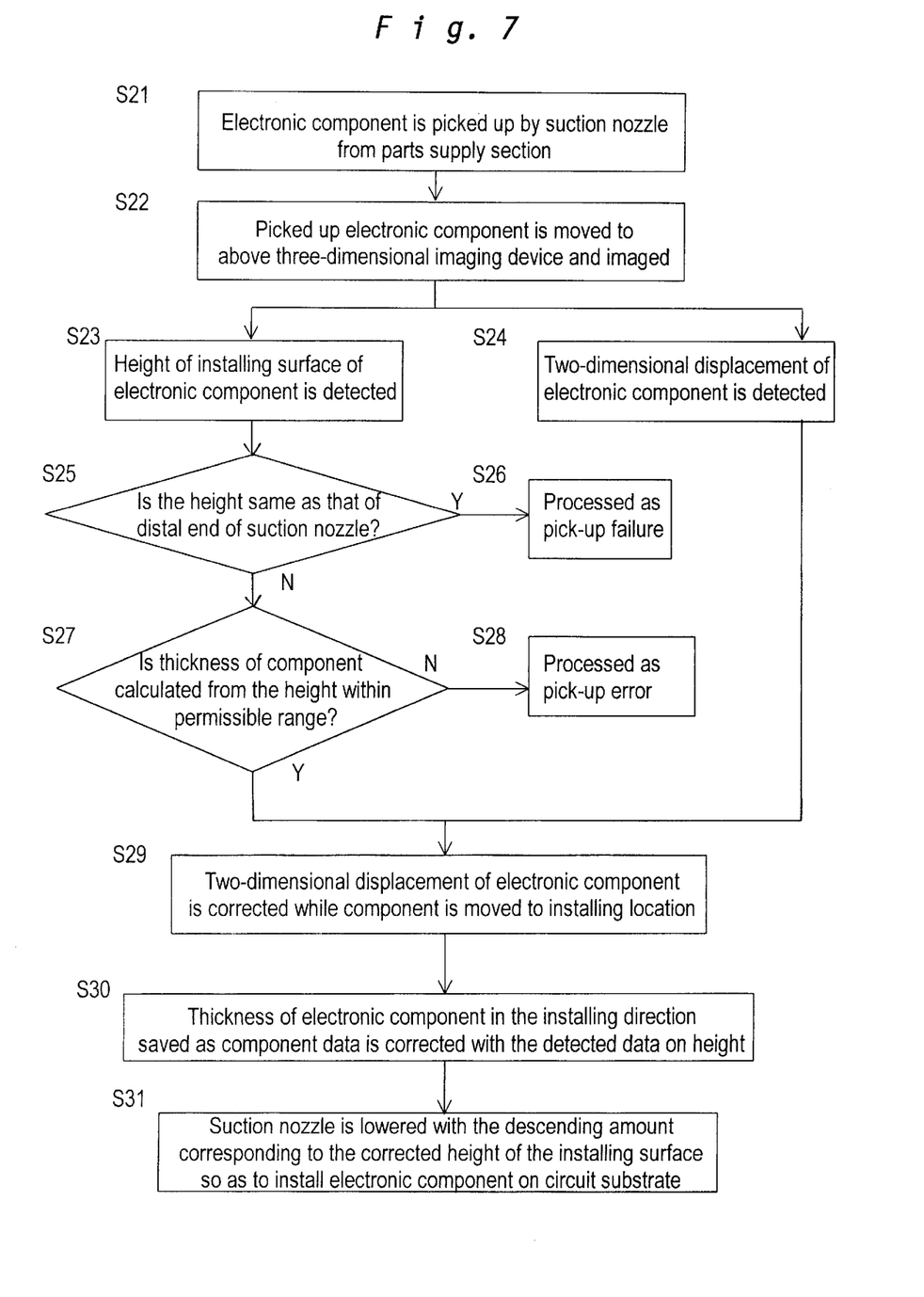
FIG. 7 is a flowchart showing the procedure of an installation method in which detection process of pick-up errors is included.

The above-described height detection using the three-dimensional imaging device 2 also allows parts pick-up failure to be detected when the suction nozzle 9 has failed to properly pick up the electronic component 10. FIG. 7 shows the steps of the third installation method in which such detection of pick-up failures is included and applied to the above second installation method. The following is the description of the procedures of the installing operation with reference to FIG. 7.

By the control of the controller 5, the mounting head 1 is moved to a point above the parts cassette 6 or parts tray 8 of the parts supply section, from which electronic components 10 which have been designated in accordance with a pre-scribed mounting order are supplied, and picks up the required electronic component 10 with the suction nozzle 9 (S21). Next, the electronic component 10 is imaged by the movement of the mounting head 1 above the three-dimensional imaging device 2 (S22). The height of the installing surface of the electronic component 10 is detected by the processing of the obtained three-dimensional image (S23), and at the same time the two-dimensional displacement of the electronic component 10 is detected (S24).

When the height of the installing surface of the electronic component 10 according to the detection results at Step 23 is approximately the same as the height of the distal end of the suction nozzle 9 (S25), it is judged that the electronic component 10 has not been picked up by the suction nozzle (pick-up failure), in which case it is necessary to carry out a recovery action for installing the corresponding electronic component 10 again, and thus a program for attending to the electronic component which has not been picked up is effected (S26). Further, in case the thickness of the electronic component 10 calculated from the height data detected at Step 23 is out of a permissible range of thickness which is set in the component data, it is judged that the electronic component 10 has been picked up in a standing state (pick-up error), in which case the process for attending to pick-up error is effected so as to execute the recovery operation similarly as in the foregoing (S28). In case the height of the installing surface of the electronic component 10 is detected without any errors at Step 25 and Step 27, the mounting head 1 corrects the detected two-dimensional displacement while moving to a point above the installing location on the circuit substrate (S29). Then, the data on the thickness of the electronic component 10 which has been preliminarily stored as the component data is corrected with reference to the detected height data (S30). The mounting head 1 which has reached above the installing location lowers the suction nozzle 9 the distance corresponding to the corrected data on thickness of the electronic component, so as to install the electronic component 10 on the circuit substrate 15 (S31).

As described above, by detecting pick-up errors at the same time when the height of the installing surface of the electronic component from the reference surface is detected with respect to each of the electronic components 10 to be installed, data required for installing components can be collectively obtained, whereby installing operation can be effectively carried out.

In detecting height from a three-dimensional image, the fact that the closer an object to be imaged to the laser beam emitting position is, the greater the output of each of the light-receiving elements 28a, 28b becomes. Thus, a portion which exhibits a greatest output value within a component existing area in the three-dimensional image is recognized as the bottom or the installing surface of the electronic component 10, and the height of this installing surface from the reference surface is determined.

Figure 8:
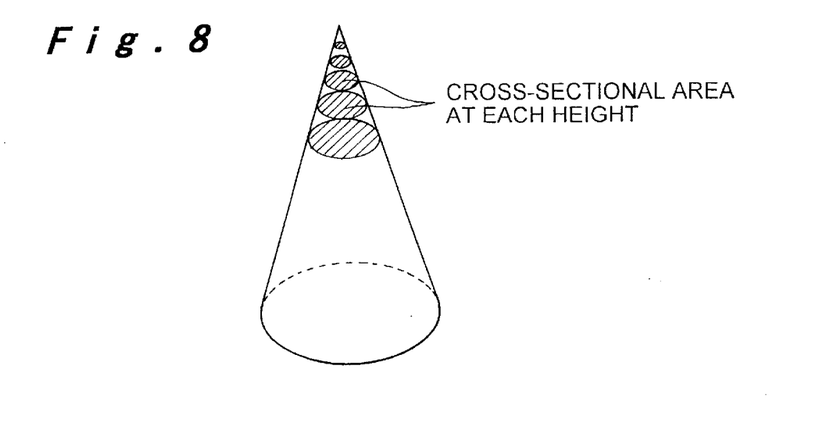
FIG. 8 is a diagram for explaining a method of eliminating the influence of noises when detecting the height of the installing surface of an electronic component from a three-dimensional image.

In an actual operation, however, noises generated in the three-dimensional imaging device 2 are inevitably included in the three-dimensional image. In order to eliminate adverse influence of noises, height is detected by reference to cross-sectional areas of the electronic component subjected to detection as shown in FIG. 8. More specifically, a reference area is determined such as to be greater than a noise size but as small as possible. Cross-sectional areas of electronic components are obtained, which are compared with the reference area, and the height at which this reference area is detected is recognized as the height of the bottom or the installing surface of the electronic component 10.

Figure 9:
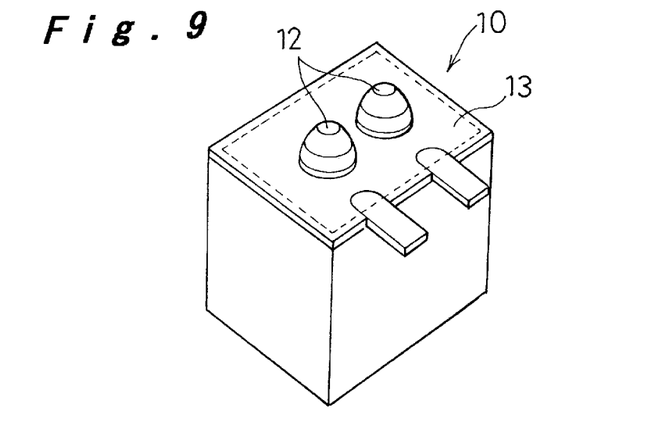
FIG. 9 is a perspective view showing one example of electronic component which has a protruded portion on an installing surface.

Some electronic components 10 include a protruded portion 12 on the bottom surface which is the installing surface as in the electronic component 10 shown in FIG. 9. In order to install such electronic component 10 on the circuit substrate 15, there is an opening provided on the circuit substrate 15 at the corresponding position for accommodating this protruded portion 12 of the electronic component 10, so that the installing surface 13 is brought into contact with the circuit substrate 15. However, when detecting the height of the installing surface 13 of the electronic component 10 with the three-dimensional imaging device 2, since the protruded portion 12 is detected as a surface nearest to the laser beam emitting position with the above described method, there will be a difference between the detected height and the actual height of the installing surface 13. In order for electronic component 10 having such protruded portion 12 on the installing surface 13 to be also handled, size information of the electronic component preliminarily stored in the component data is utilized. This method of detecting height will be hereinafter described.

Figure 10:
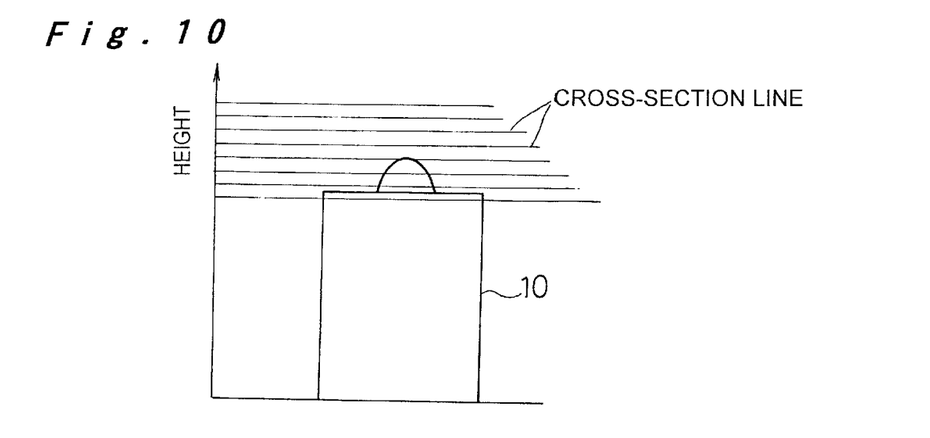
FIG. 10 is a diagram for explaining a method of detecting the height of the installing surface of an electronic component.

Size information with respect to each type of electronic components 10 is stored in the above mentioned component data. The area of the installing surface 13 can be obtained by multiplying the length and the width of the installing surface 13; this area is defined as a reference area. Cross-sectional areas of electronic components in the three-dimensional image are calculated at each height as shown in FIG. 10 and compared with the reference area, and the height at which the cross-sectional area equals to the reference area is recognized as the installing surface. In an actual practice, the reference area is determined slightly smaller than the value obtained by multiplying the length and the width of the electronic component 10, for example 20% less than the multiplied value, taking account of rounded corners of the electronic component 10 or measuring errors at the time of measurement when preparing the component data.

Figure 11:
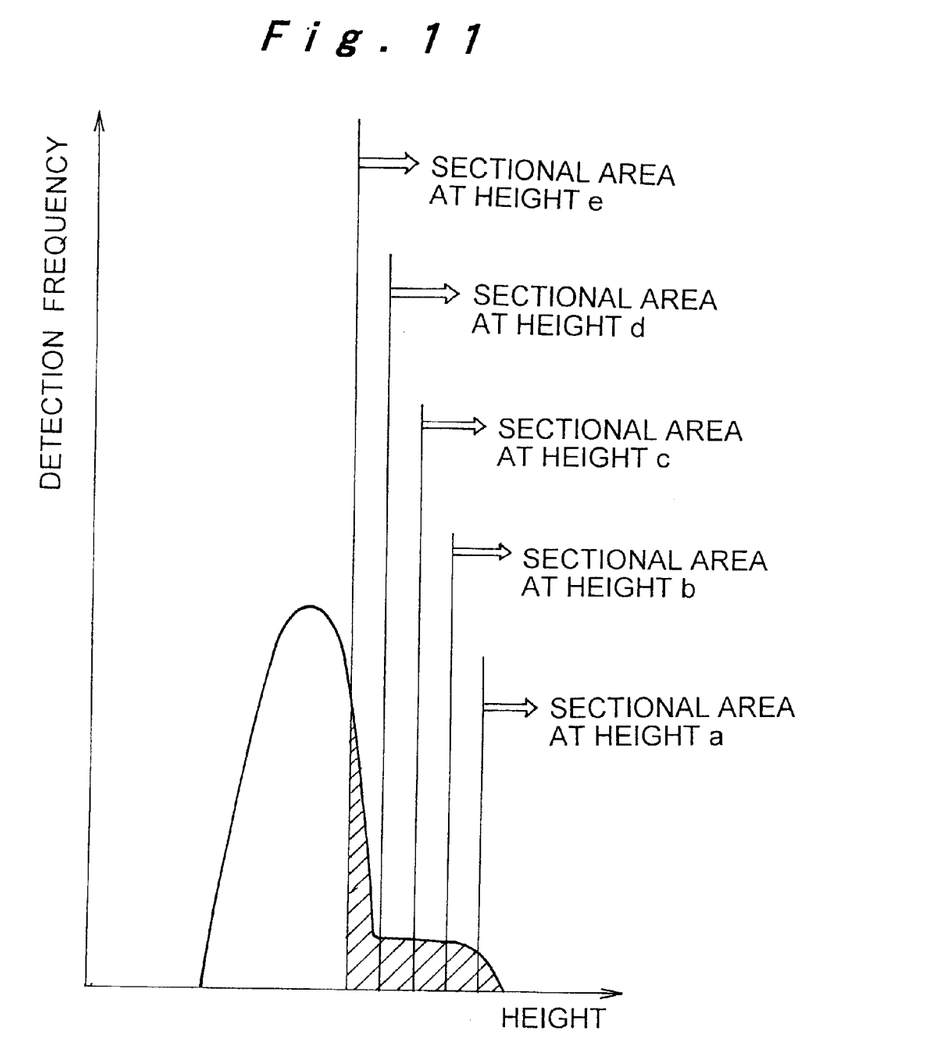
FIG. 11 is a diagram for explaining a method of detecting the height of the installing surface of an electronic component with the use of a histogram.

The above-described height detection with reference to a reference area is effected such that a histogram of detection frequency at each height as shown in FIG. 11 is made from detected results of height data of the electronic component within the component existing area in the three-dimensional image, and the detection frequency is integrated from a higher side in the histogram to obtain cross-sectional areas at each height of the electronic component 10. The height at which the obtained value equals to the reference area is recognized as the height of the installing surface 13 of the electronic component 10.

Some electronic components 10 include leads which are inserted into corresponding holes formed in the circuit substrate 15. There are also bump connection type components that have a bump electrode which is deformed on receiving the pressure at the time of installation, thereby being connected to the electrodes on the circuit substrate 15. When installing these types of electronic components, it is necessary to precisely apply a prescribed amount of pressure thereon, and therefor pressure control is executed. Specifically, pressure is applied while the parts holding means such as the suction nozzle 9 is lowered at a low speed, with a feedback of pressing resistance against the circuit substrate 15.

Figure 12:
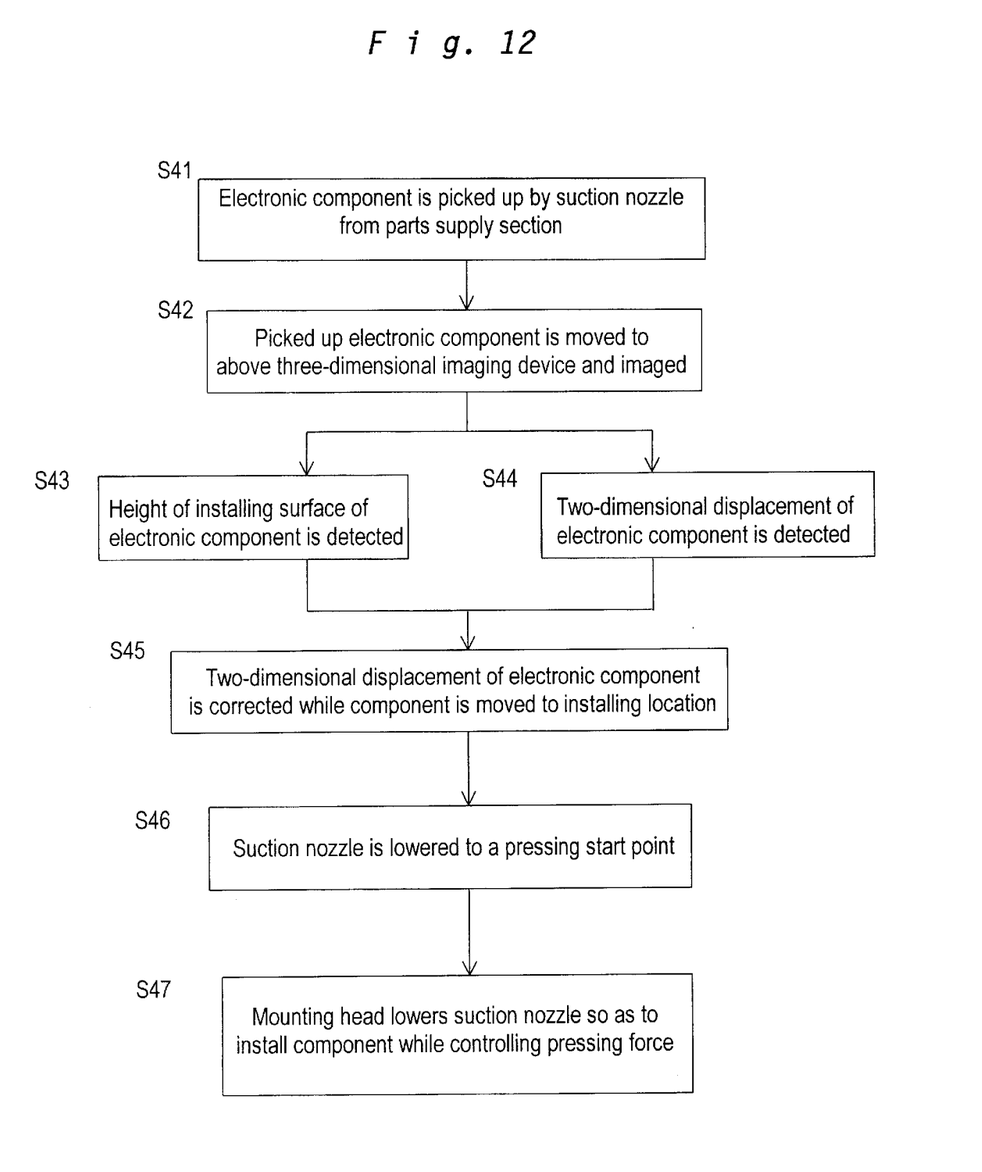
FIG. 12 is a flowchart showing the procedure of an installation method of an electronic component which requires pressing control.

FIG. 12 shows another procedure for carrying out installation of the electronic components 10 which require such pressure control, in which the process from Step 41 (S41) to Step 45 (S45) is identical to Step 1 (S1) to Step 5 (S5) shown in FIG. 5. At Step 46, the mounting head 1 that has moved to a point above the installing location lowers the suction nozzle 9 the distance corresponding to the height of the installing surface of the electronic component 10 detected by the three-dimensional imaging device 2 to a pressing start point (S46), from which the pressure control is started, and the suction nozzle 9 is further descended to the lowermost position so that the electronic component 10 is pressed on the circuit substrate 15 in a squeezing manner (S47).

As described above, even when installing an electronic component 10 which requires pressure control, since the necessary amount of lowering the suction nozzle 9 has been accurately obtained, the pressing start point can be set at a certain height even nearer to the circuit substrate 15, the overall installation time can be reduced.

As set forth above, according to the present invention, since the height of the installing surface of an electronic component held by the parts holding means is detected by the three-dimensional imaging device, and the descending distance of the parts holding means towards the circuit substrate is accurately determined based on this detected value, it is avoided that the electronic component receives pressure greater than necessary and thus is less likely to be damaged. Accordingly, precise or fragile components are prevented from being damaged and installing error will hardly occur, whereby electronic component installation of high reliability can be accomplished.

While a preferred embodiment of the invention has been described using specific terms, such description is for illustrative purposes only, and it is to be understood that changes and variations may be made without departing from the spirit or scope of the following claims.

What is claimed is:

1. A method of installing an electronic component on a circuit substrate with a mounting head equipped with a parts holding means with which the electronic component is held comprising the steps of:

a first step of picking up a prescribed electronic component with the parts holding means from a parts supply section;

a second step of moving the mounting head which has picked up the electronic component from the parts supply section to a point above a three-dimensional imaging device;

a third step of detecting a distance from a surface of the circuit substrate on which said electronic component is to be mounted to an installing surface of the electronic component that is held on the parts holding means;

a fourth step of determining an amount of lowering the parts holding means for placing the electronic component on the circuit substrate based on a detected distance; and a fifth step of lowering the parts holding means by the determined descending amount to a height where the installing surface of the electronic component makes contact with the circuit substrate.

2. The method of installing an electronic component according to claim 1, wherein in the step of detecting the height of the installing surface of the electronic component with the three-dimensional imaging device, a portion within an electronic component existing area in a three-dimensional image of the electronic component where a greatest value is detected is determined to be the installing surface of the electronic component.

3. The method of installing an electronic component according to claim 1, wherein in the step of detecting the height of the installing surface of the electronic component with the three-dimensional imaging device, an area which is greater than a noise size in a three-dimensional image of the electronic component but as small as possible is defined as a reference area, cross-sectional areas of the electronic component at each height are obtained, which are then compared with the reference area, and a height at which said reference area is detected within an electronic component existing area is recognized as the height of the installing surface of the electronic component.

4. The method of installing an electronic component according to claim 3, wherein a histogram of detection frequency at each height of the electronic component in the three-dimensional image is made so as to obtain the cross-sectional areas of the electronic component at each height.

5. The method of installing an electronic component according to claim 1, wherein in the step of detecting the height of the installing surface of the electronic component with the three-dimensional imaging device, an area of the installing surface of the electronic component which has been preliminarily obtained is defined to be a reference area, cross-sectional areas of the electronic component at each height are obtained, which are then compared with the reference area, and a height at which said reference area is detected within an electronic component existing area is recognized as the height of the installing surface of the electronic component.

6. The method of installing an electronic component according to claim 5, wherein a histogram of detection frequency at each height of the electronic component in the three-dimensional image is made, so as to obtain the cross-sectional areas of the electronic component at each height.

7. A method of installing an electronic component on a circuit substrate comprising the steps of:

preparing component data by measuring dimensions of electronic components and preliminarily storing the component data with respect to every type of electronic components to be installed;

moving on a horizontal plane a mounting head equipped with a parts holding means with which the electronic component is held;

picking up a prescribed electronic component with the parts holding means from a parts supply section;

moving the mounting head which has picked up the electronic component from the parts supply section to a point above a three-dimensional imaging device;

detecting a height of an installing surface of the electronic component from a surface of the circuit substrate on which said electronic component is to be mounted;

obtaining a thickness of the electronic component from a detected result;

correcting the component data of the electronic component in accordance with the obtained thickness of the electronic component;

determining a lowering amount of the parts holding means in accordance with the corrected information; and placing the electronic component on the circuit substrate in a predetermined installing location by lowering the parts holding means by the determined lowering amount.

8. The method of installing an electronic component according to claim 7, wherein in the step of detecting the height of the installing surface of the electronic component with the three-dimensional imaging device, a portion within an electronic component existing area in a three-dimensional image of the electronic component where a greatest value is detected is determined to be the installing surface of the electronic component.

9. The method of installing an electronic component according to claim 7, wherein in the step of detecting the height of the installing surface of the electronic component with the three-dimensional imaging device, an area which is greater than a noise size in a three-dimensional image of the electronic component but as small as possible is defined as a reference area, cross-sectional areas of the electronic component at each height are obtained, which are then compared with the reference area, and a height at which said reference area is detected within an electronic component existing area is recognized as the height of the installing surface of the electronic component.

10. The method of installing an electronic component according to claim 9, wherein a histogram of detection frequency at each height of the electronic component in the three-dimensional image is made, so as to obtain the cross-sectional areas of the electronic component at each height.

11. The method of installing an electronic component according to claim 7, wherein in the step of detecting the height of the installing surface of the electronic component with the three-dimensional imaging device, an area of the installing surface of the electronic component which has been preliminarily obtained is defined to be a reference area, cross-sectional areas of the electronic component at each height are obtained, which are then compared with the reference area, and a height at which said reference area is detected within an electronic component existing area is recognized as the height of the installing surface of the electronic component.

12. The method of installing an electronic component according to claim 11, wherein a histogram of detection frequency at each height of the electronic component in the three-dimensional image is made, so as to obtain the cross-sectional areas of the electronic component at each height.

13. The method of installing an electronic component according to claim 7, wherein when an abnormal value is detected as a height detection result, it is judged that the parts holding means has failed to pick up the electronic component correctly.

14. The method of installing an electronic component according to claim 7, further including, in case of handling electronic components which require pressing control, the step of preparing a data regarding a position for starting such pressing control and storing such pressing start position data prior to an actual operation, and the step of correcting the pressing start position data based on a height detection result, whereby the lowering of the parts holding means is controlled.

15. A system of installing electronic components on a substrate comprising:
   a source of electronic components;
   a component holding unit that can removably secure an electronic component from the source and translate it to the substrate;
   a detector for imaging the electronic component held by the component holding unit, to provide imaging data;
   means for determining a height of the electronic component from the image data and a relative distance to move the component holding unit to a proper position relative to the substrate; and
   means for moving the component holding unit to the proper position based on a predetermined incremental movement amount added to an output from the means for determining to insure a predetermined pressing force is applied to the substrate by the electronic component.

16. The system of claim 15 further including determining a cross-sectional area of the electronic component from the image data and means for determining the installing surface of the electronic component based on the cross-sectional area.

17. The system of claim 16 further including means for storing a histogram of detection frequency at each height of the electronic component in a three-dimensional image so as to obtain the cross-sectional areas of the electronic component at each height.

18. The system of claim 17 further including means for storing a reference area value of the electronic component which represents a value smaller than a length and a width of the electronic component multiplied and the means for determining the installing surface compares the imaging data with the stored reference area.

19. A system of installing electronic components on a substrate comprising:
   a source of electronic components;
   a component holding unit that can removably secure an electronic component from the source and translate it to the substrate;
   a detector for imaging the electronic component held by the component holding unit to provide image data;
   means for determining a cross-sectional area of the electronic component from the image data;
   means for storing a reference area value of the electronic component which represents a value smaller than a length and a width of the electronic component multiplied;
   means for determining the installing surface of the electronic component by comparing the cross-sectional area with the stored reference area value;
   means for determining a height of the electronic component from the image data and a relative distance to move the component holding unit and the electronic installing surface to a proper position relative to the substrate; and
   means for moving the component holding unit to the proper position based on an output from the means for determining.

* * * * *